US012624251B2

(12) United States Patent
Lee et al.

(10) Patent No.: US 12,624,251 B2
(45) Date of Patent: May 12, 2026

(54) CMP SLURRY COMPOSITION FOR PATTERNED TUNGSTEN WAFER AND METHOD OF POLISHING PATTERNED TUNGSTEN WAFER USING THE SAME

(71) Applicant: SAMSUNG SDI CO., LTD., Yongin-si (KR)

(72) Inventors: Ji Ho Lee, Suwon-si (KR); Young Gi Lee, Suwon-si (KR); Soo Yeon Sim, Suwon-si (KR); Hyun Woo Lee, Suwon-si (KR); Jong Won Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 777 days.

(21) Appl. No.: 17/891,649

(22) Filed: Aug. 19, 2022

(65) Prior Publication Data

US 2023/0108531 A1 Apr. 6, 2023

(30) Foreign Application Priority Data

Aug. 23, 2021 (KR) ........................ 10-2021-0110612

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 5,869,581 | A | 2/1999 | Tysak | |
| 5,990,333 | A | 11/1999 | Allen et al. | |
| 7,531,105 | B2 * | 5/2009 | Dysard | H01L 21/31053 438/692 |
| 9,862,862 | B2 * | 1/2018 | Lan | H01L 21/30625 |
| 2005/0150598 | A1 | 7/2005 | Moeggenborg et al. | |
| 2009/0081871 | A1 * | 3/2009 | Dysard | C09K 3/1463 438/693 |
| 2009/0215271 | A1 | 8/2009 | Dysard et al. | |
| 2011/0175089 | A1 | 7/2011 | Zheng et al. | |
| 2012/0028466 | A1 | 2/2012 | Mcconnell et al. | |
| 2012/0235081 | A1 | 9/2012 | Raman et al. | |
| 2013/0203254 | A1 | 8/2013 | Tamada et al. | |
| 2021/0017421 | A1 * | 1/2021 | Ward | C08K 3/28 |
| 2021/0108106 | A1 * | 4/2021 | Liang | H01L 21/31053 |

FOREIGN PATENT DOCUMENTS

| | | | | |
|---|---|---|---|---|
| CN | 1784770 | A | 6/2006 | |
| CN | 1906260 | A | 1/2007 | |
| CN | 103154168 | A | 6/2013 | |
| CN | 105229097 | A | 1/2016 | |
| CN | 106133881 | A | 11/2016 | |
| CN | 107686702 | A | 2/2018 | |
| CN | 107686703 | A | 2/2018 | |
| CN | 111732898 | A | 10/2020 | |
| JP | 5544244 | B2 * | 7/2014 | C09K 3/1409 |
| KR | 10-0481380 | B1 | 5/2005 | |
| KR | 2006/0121292 | A | 11/2006 | |
| KR | 10-2008-0078818 | A | 8/2008 | |

OTHER PUBLICATIONS

Korean Office Action issued on Jul. 17, 2024, in the corresponding Korean Patent Application No. 10-2021-0110612 claimed as the priority.
Chinese Office Action issued on Oct. 10, 2023, in the corresponding Chinese Patent Application No. 202211011094.3.
Office Action issued on Nov. 10, 2023, of the corresponding Taiwanese Patent Application No. 111131483.
Korean Notice of Allowance dated Mar. 10, 2025.

* cited by examiner

*Primary Examiner* — Shamim Ahmed
(74) *Attorney, Agent, or Firm* — Lee IP Law, P.C.

(57) ABSTRACT

A CMP slurry composition for patterned tungsten wafers and a method of polishing patterned tungsten wafers using the same, the CMP slurry composition includes a solvent; an abrasive; and a non-dendrimeric poly(amidoamine).

11 Claims, No Drawings

CMP SLURRY COMPOSITION FOR PATTERNED TUNGSTEN WAFER AND METHOD OF POLISHING PATTERNED TUNGSTEN WAFER USING THE SAME

CROSS-REFERENCE TO RELATED APPLICATION

This application claims the benefit of Korean Patent Application No. 10-2021-0110612, filed on Aug. 23, 2021, in the Korean Intellectual Property Office, the entire disclosure of which is incorporated herein by reference.

BACKGROUND

1. Field

Embodiments relate to a CMP slurry composition for patterned tungsten wafers and a method of polishing patterned tungsten wafers using the same.

2. Description of the Related Art

Chemical mechanical polishing (CMP) compositions and methods for polishing (or planarizing) substrate surfaces have been considered. A metal layer polishing process using a CMP composition may include polishing only an initial metal layer, polishing the metal layer and a barrier layer, and polishing the metal layer, the barrier layer, and an oxide film.

A composition for polishing a metal layer (e.g., tungsten) on a semiconductor substrate may include abrasive particles suspended in an aqueous solution and a chemical accelerator, such as an oxidant and a catalyst in the aqueous solution.

SUMMARY

The embodiments may be realized by providing a CMP slurry composition for patterned tungsten wafers, the CMP slurry composition including a solvent; an abrasive; and a non-dendrimeric poly(amidoamine).

The non-dendrimeric poly(amidoamine) may have a random hyperbranched structure.

The non-dendrimeric poly(amidoamine) may include a primary amine group ($NH_2$), a secondary amine group (NH), a carboxyl group (COOH), or COOZ, in which Z is a $C_1$ to $C_4$ alkyl group.

The non-dendrimeric poly(amidoamine) may include the primary amine group ($NH_2$) or the secondary amine group (NH); and the carboxyl group (COOH) or COOZ, in which Z is a $C_1$ to $C_4$ alkyl group.

The non-dendrimeric poly(amidoamine) may be prepared by reacting an ester having at least one ester group and at least one C═C bond with an amine having at least one primary amine group.

The non-dendrimeric poly(amidoamine) may be prepared by reacting an ester having at least one ester group and at least one C═C bond with a diamine having two primary amine groups.

The non-dendrimeric poly(amidoamine) may be prepared by reacting a diester having two ester groups and one C═C bond with a diamine having two primary amine groups.

The diester may include a compound represented by Formula 1,

[Formula 1]

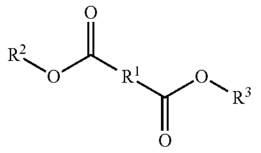

in Formula 1, $R^1$ may be a divalent substituted or unsubstituted $C_2$ to $C_4$ alkylene group having at least one C═C bond, and $R^2$ and $R^3$ may each independently be a $C_1$ to $C_4$ alkyl group; and the diamine may include a substituted or unsubstituted $C_2$ to $C_6$ alkylene diamine.

The CMP slurry composition may include 0.001 wt % to 20 wt % of the abrasive, and 0.0001 wt % to 0.1 wt % of the non-dendrimeric poly(amidoamine), all wt % being based on a total weight of the CMP slurry composition.

The CMP slurry composition may further include an oxidant, a catalyst, or an organic acid.

The CMP slurry composition may have a pH of 1 to 6.

The embodiments may be realized by providing a tungsten polishing method comprising polishing tungsten using the CMP slurry composition for patterned tungsten wafers according to an embodiment.

DETAILED DESCRIPTION

As used herein to represent a specific numerical range, the expression "X to Y" means "greater than or equal to X and less than or equal to Y". As used herein, the term "or" is not an exclusive term, e.g., "A or B" would include A, B, or A and B.

In an implementation, inclusion of a non-dendrimeric poly(amidoamine) into a CMP slurry composition for patterned tungsten wafers may help improve flatness of patterned tungsten wafers, minimize reduction in polishing rate with respect to patterned tungsten wafers, and reduce corrosion of patterned tungsten wafers.

A CMP slurry composition for patterned tungsten wafers according to an embodiment (hereinafter also referred to as a "CMP slurry composition") may include, e.g., a solvent, an abrasive, and a non-dendrimeric poly(amidoamine). Now, each of the components will be described in more detail.

Solvent

The solvent may serve to reduce friction upon polishing patterned tungsten wafers using the abrasive.

The solvent may include, e.g., a polar solvent, a nonpolar solvent, or a combination thereof. In an implementation, the solvent may include water (e.g., ultrapure water or deionized water), organic amines, organic alcohols, organic alcohol amines, organic ethers, or organic ketones. In an implementation, the solvent may be ultrapure water or deionized water. In an implementation, the solvent may be present, e.g., in a balance amount in the CMP slurry composition.

Abrasive

The abrasive may polish patterned tungsten wafers at a high polishing rate. The abrasive may include, e.g., metal or non-metal oxide abrasive particles. In an implementation, the abrasive may include, e.g., among silica, alumina, ceria, titania, or zirconia. In an implementation, the abrasive may be silica (e.g., colloidal silica).

The abrasive may be spherical or aspherical particles having an average primary particle diameter ($D_{50}$) of 10 nm to 200 nm, e.g., 20 nm to 180 nm or 30 nm to 150 nm. Within these ranges, the abrasive may polish patterned tungsten wafers at a higher polishing rate. Herein, the "average particle diameter ($D_{50}$)" is a typical particle diameter measure and refers to a particle diameter corresponding to 50% by volume in a volume cumulative distribution of abrasive particles.

In an implementation, the abrasive may have a positive charge of, e.g., 10 mV to 50 mV. Within this range, the abrasive may polish a patterned tungsten wafer at a higher polishing rate.

In an implementation, the abrasive may be present in an amount of 0.001 wt % to 20 wt %, e.g., 0.01 wt % to 15 wt %, 0.05 wt % to 10 wt %, or 0.1 wt % to 8 wt %, in the CMP slurry composition, the wt % being based on a total weight of the composition. Within these ranges, the abrasive may polish patterned tungsten wafers at a higher polishing rate while improving dispersion stability of the CMP slurry composition.

Non-Dendrimeric Poly(amidoamine)

The non-dendrimeric poly(amidoamine) is a corrosion inhibitor and may help improve flatness of patterned tungsten wafers, may help minimize reduction in polishing rate with respect to patterned tungsten wafers, and may help reduce corrosion of tungsten.

The non-dendrimeric poly(amidoamine) may refer to a random hyperbranched copolymer that does not have a dendrimeric structure and contains multiple amidoamine units.

In an implementation, the non-dendrimeric poly(amidoamine) may have a weight average molecular weight of, e.g., 800 g/mol to 50,000 g/mol, 800 g/mol, 1,000 g/mol, 1,500 g/mol, 2,000 g/mol, 2,500 g/mol, 3,000 g/mol, 3,500 g/mol, 4,000 g/mol, 4,500 g/mol, 5,000 g/mol, 5,500 g/mol, 6,000 g/mol, 6,500 g/mol, 7,000 g/mol, 7,500 g/mol, 8,000 g/mol, 8,500 g/mol, 9,000 g/mol, 9,500 g/mol, 10,000 g/mol, 10,500 g/mol, 11,000 g/mol, 11,500 g/mol, 12,000 g/mol, 12,500 g/mol, 13,000 g/mol, 13,500 g/mol, 14,000 g/mol, 15,000 g/mol, 16,000 g/mol, 17,000 g/mol, 18,000 g/mol, 19,000 g/mol, 20,000 g/mol, 30,000 g/mol, 40,000 g/mol, 50,000 g/mol, 1,200 g/mol to 30,000 g/mol, or 2,000 g/mol to 10,000 g/mol. Herein, the "weight average molecular weight" may be measured by a typical method known to those skilled in the art, for example, by polystyrene conversion.

Herein, the "dendrimeric structure" refers to a macromolecular structure having regular branches from a molecular core to a molecular terminal. The non-dendrimeric poly (amidoamine) may have a molecular structure having irregular branches extending from a molecular core to a molecular terminal.

A random hyperbranched structure may provide reduction in corrosion of patterned tungsten wafers and improvement in flatness of patterned tungsten wafers through effective adsorption onto a tungsten surface over an acidic pH range.

The non-dendrimeric poly(amidoamine) may include, e.g., a primary amine group ($NH_2$), a secondary amine group (NH), a carboxyl group (COOH), or COOZ (in which Z is a substituted or unsubstituted $C_1$ to $C_4$ alkyl group) at a terminal thereof or in a molecular structure thereof. Each of the primary amine group ($NH_2$) and the secondary amine group (NH) may help reduce corrosion of patterned tungsten wafers by allowing the non-dendrimeric poly(amidoamine) to effectively bond to a tungsten surface. Each of the carboxyl group (COOH) and COOZ may help minimize reduction in polishing rate with respect to patterned tungsten wafers by facilitating access of the abrasive upon adsorption of the non-dendrimeric poly(amidoamine) onto a tungsten surface over an acidic pH range.

In an implementation, the non-dendrimeric poly(amidoamine) may include, e.g., at least one of the primary amine group ($NH_2$) and the secondary amine group (—NH—); at least one of the carboxyl group (COOH) and COOZ (where Z is a $C_1$ to $C_4$ alkyl group); or a combination thereof, at a terminal thereof or in a molecular structure thereof.

In an implementation, the non-dendrimeric poly(amidoamine) may have, e.g., a main chain composed of an amide group (—CONH—) and the secondary amine group (—NH—); and a terminal functional group including an amine group including the primary amine group (—$NH_2$) and the secondary amine group (NH), the carboxyl group (COOH), and COOZ.

A proportion of the carboxyl group (COOH) and COOZ of the terminal functional group may be, e.g., 10% to 60%, 10%, 15%, 20%, 25%, 30%, 35%, 40%, 45%, 50%, 55%, 60%, or 20% to 40%. Within these ranges, the non-dendrimeric poly(amidoamine) may help minimize a reduction in polishing rate. Herein, the "proportion of a terminal functional group" may refer to an area ratio of the terminal functional group to the non-dendrimeric poly(amidoamine), as measured by a nuclear magnetic resonance (NMR) assay.

Each of the primary amine group and the secondary amine group may be modified by a predetermined method. In an implementation, each of the primary amine group and the secondary amine group may be modified through reaction with a compound having a cyclic carbonate group, an isocyanate group, an anhydride group, an acylate group, or an epoxy group.

In an implementation, at least one of the primary amine group ($NH_2$), the secondary amine group (NH), the carboxyl group (COOH), COOZ, and —C(═O)—NH— in the non-dendrimeric poly(amidoamine) may be linked to a linear or branched aliphatic hydrocarbon group (e.g., a polyvalent $C_1$ to $C_{10}$ aliphatic hydrocarbon group).

The non-dendrimeric poly(amidoamine) may be prepared by reacting an ester (having at least one ester group and at least one C═C bond) with an amine (having at least one primary amine group). In an implementation, the non-dendrimeric poly(amidoamine) may be prepared by reacting an ester (having at least one ester group and at least one C═C bond) with a diamine (having two primary amine groups).

In an implementation, the non-dendrimeric poly(amidoamine) may be prepared by reacting a diester (having three functional groups capable of reacting with an amine) with a diamine (having two primary amine groups). In an implementation, the functional groups may refer to or include two ester groups and one C═C bond, e.g. —CH═CH—.

In an implementation, the diester may include a compound represented by Formula 1.

[Formula 1]

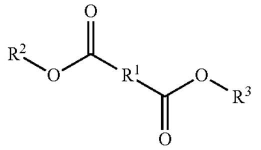

In Formula 1, $R^1$ may be or may include, e.g., a divalent substituted or unsubstituted $C_2$ to $C_4$ alkylene group having at least one C═C bond. $R^2$ and $R^3$ may each independently be or include, e.g., a substituted or unsubstituted $C_1$ to $C_4$ alkyl group.

In an implementation, $R^2$ and $R^3$ may each independently be, e.g., a methyl group or an ethyl group. In an implementation, $R^2$ and $R^3$ may each independently be, e.g., an ethyl group.

In an implementation, the diester may include a compound represented by Formula 2.

[Formula 2]

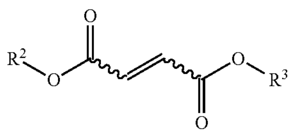

In Formula 2, $R^2$ and $R^3$ may be defined the same as those of Formula 1.

In an implementation, the diester may include, e.g., diethyl fumarate (Formula 3a), dimethyl fumarate (Formula 3b), diethyl maleate (Formula 4), diethyl itaconate, diethyl citraconate, or diethyl mesaconate.

[Formula 3a]

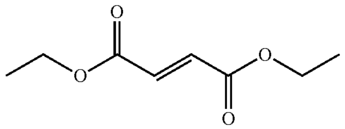

[Formula 3b]

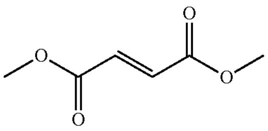

[Formula 4]

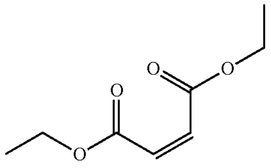

The diamine may include a linear, a cyclic, or an aromatic diamine having two primary amine groups. In an implementation, the diamine may include an alkyl group and an alkylene group. In an implementation, the diamine may be, e.g., a substituted or unsubstituted $C_2$ to $C_6$ alkylene diamine, wherein the primary amine groups may be placed at both ends of an alkylene chain. Herein, the term "substituted" in the expression "substituted or unsubstituted" may mean that at least one hydrogen atom in a corresponding functional group is substituted with a $C_1$ to $C_{10}$ alkyl group or a $C_6$ to $C_{10}$ aryl group.

In an implementation, the diamine may include, e.g., ethylenediamine, 1,4-butanediamine, 2-methylpentamethylenediamine, pentamethylenediamine, or hexamethylenediamine (Formula 5).

[Formula 5]

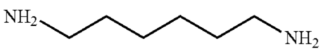

In preparation of the non-dendrimeric poly(amidoamine), a molar ratio of the diamine to the diester may range from 1.1 to 2.9. Within this range, the non-dendrimeric poly (amidoamine) may be formed without undergoing gelation.

In preparation of the non-dendrimeric poly(amidoamine), the diester and diamine may react with each other in the presence of 5 wt % to 25 wt % of water based on the weight of a reaction mixture including the diester and the diamine. The diester and the diamine may react with each other at a temperature of 150° C. or less, e.g., 50° C. to 150° C. Within this range, formation of a random hyperbranched structure may be facilitated through prevention of intermolecular amidation.

Next, a process of preparing the non-dendrimeric poly (amidoamine) will be described, in which the diester is diethyl maleate and the diamine is hexamethylenediamine.

Diethyl maleate and hexamethylenediamine may form a compound represented by Formula 6, which is a secondary amine compound, through Michael addition.

[Formula 6]

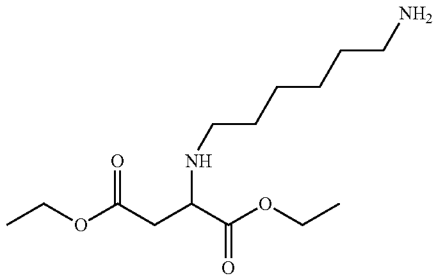

In the presence of water, an ester group of the compound represented by Formula 6 may be hydrolyzed into a carboxyl group, which, in turn, may form a salt with another hexamethylenediamine, thereby forming a compound represented by Formula 7:

[Formula 7]

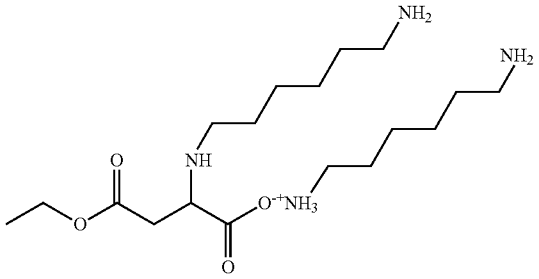

After removing the water, the compound represented by Formula 7 may form a compound represented by Formula 8:

[Formula 8]

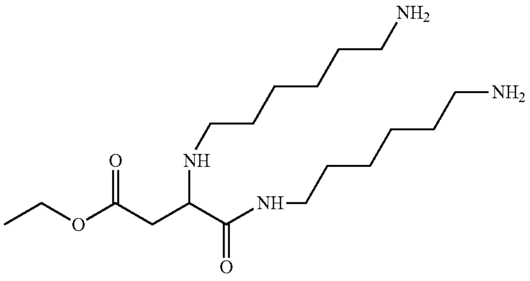

In the presence of water, an ester group of the compound represented by Formula 8 may be hydrolyzed into a carboxyl group, which, in turn, may form a salt with another hexamethylenediamine, thereby forming a compound represented by Formula 9:

[Formula 9]

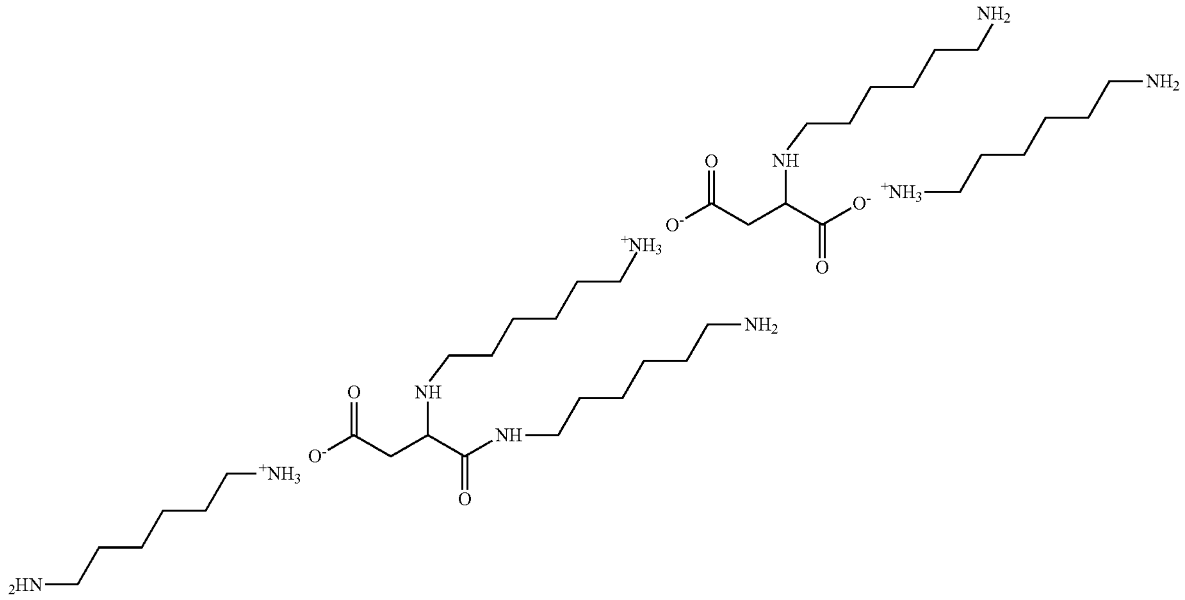

After removing the water again, the compound represented by Formula 9 may form a compound represented by Formula 10:

[Formula 10]

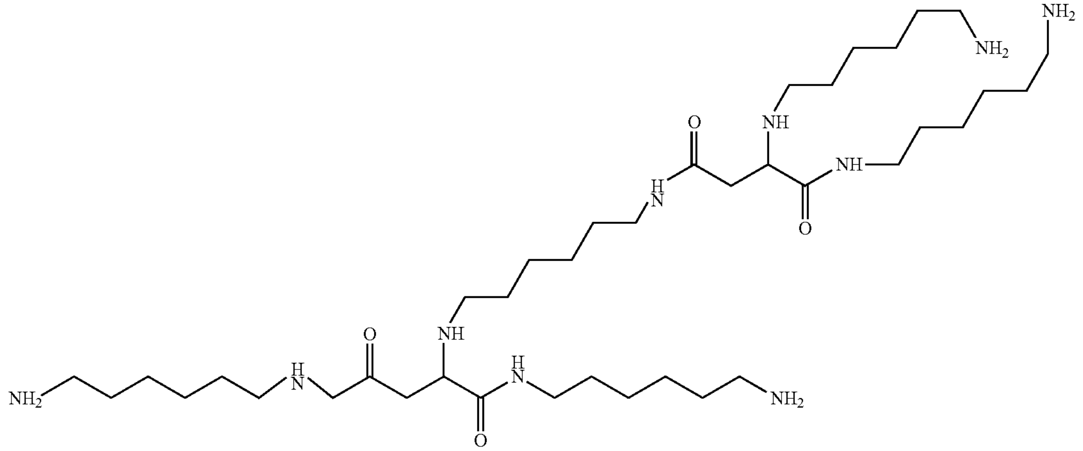

The non-dendrimeric poly(amidoamine) may be formed through repetition of the above process.

A carboxyl group may be introduced into the non-dendrimeric poly(amidoamine) by hydrolysis of unreacted ester functional groups, which have not reacted with the diamine.

In an implementation, the non-dendrimeric poly(amidoamine) may be a commercially available product (e.g., Helux 3316 (Formula 11)

[Formula 11]
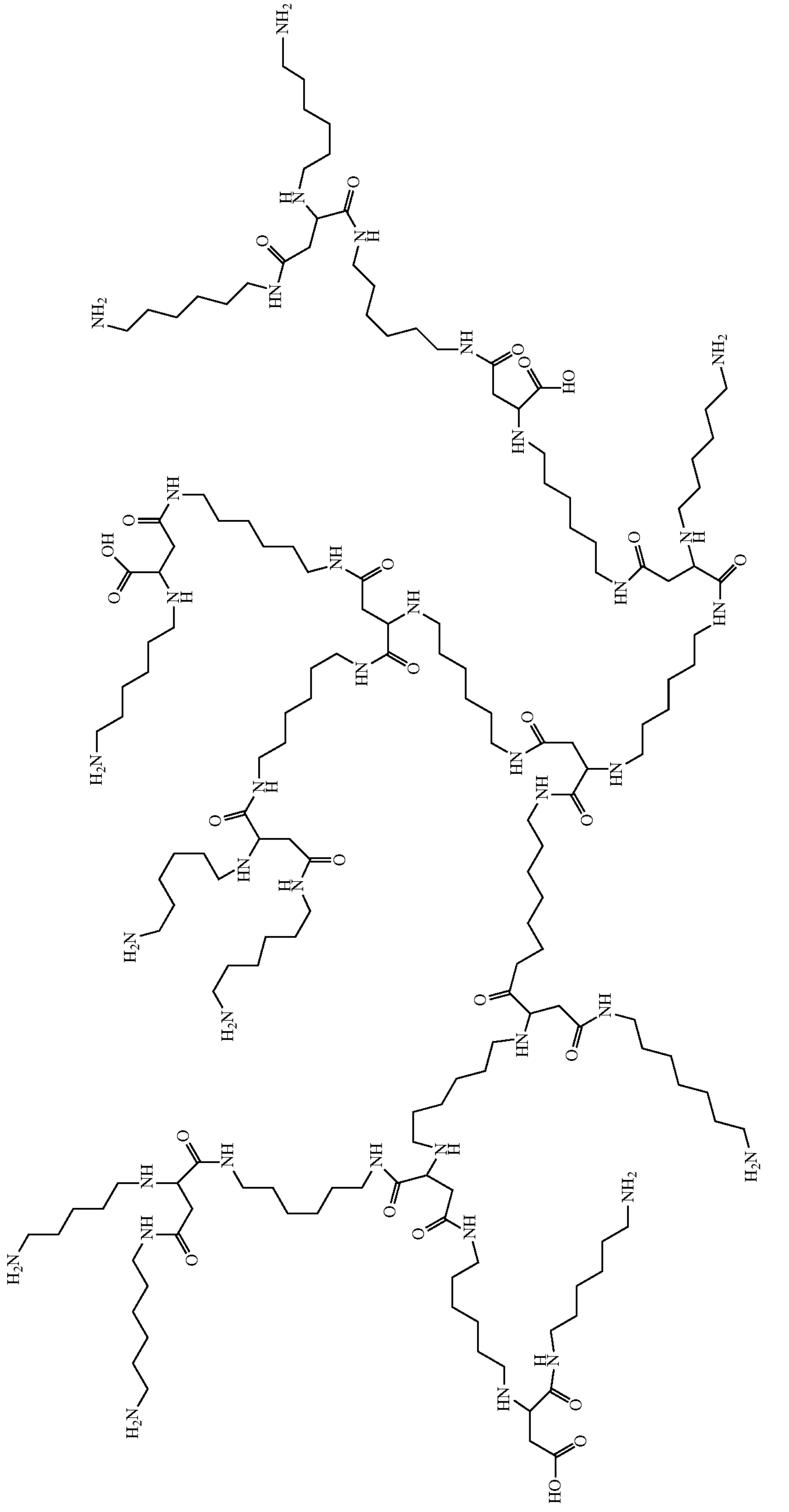

In an implementation, the non-dendrimeric poly(amidoamine) may be present in an amount of, e.g., 0.0001 wt % to 0.1 wt %, 0.0001 wt %, 0.0005 wt %, 0.001 wt %, 0.002 wt %, 0.003 wt %, 0.004 wt %, 0.005 wt % %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.001 wt % to 0.02 wt %, or 0.002 wt % to 0.01 wt %, in the CMP slurry composition. Within these ranges, the non-dendrimeric poly(amidoamine) may further improve flatness of patterned tungsten wafers while further reducing corrosion of patterned tungsten wafers.

In an implementation, the non-dendrimeric poly(amidoamine) may be present in an amount of, e.g., 80 wt % or more, 80 wt %, 85 wt %, 90 wt %, 95 wt %, 100 wt %, or 80 wt % to 100 wt %, based on the total weight of the corrosion inhibitor in the composition.

In an implementation, the CMP slurry composition may further include, e.g., an oxidant, a catalyst, or an organic acid.

Oxidant

The oxidant may facilitate polishing of a patterned tungsten wafer by oxidizing the patterned tungsten wafer.

Examples of the oxidant may include an inorganic per-compound, an organic per-compound, bromic acid or a salt thereof, nitric acid or a salt thereof, chloric acid or a salt thereof, chromic acid or a salt thereof, iodic acid or a salt thereof, iron or a salt thereof, copper or a salt thereof, a rare-earth metal oxide, a transition metal oxide, and potassium dichromate. These may be used alone or as a mixture thereof. Herein, "per-compound" refers to a compound containing at least one peroxide group (—O—O—) or containing an element in the highest oxidation state. In an implementation, the oxidant may include a per-compound (e.g., hydrogen peroxide, potassium periodate, calcium persulfate, or potassium ferricyanide). In an implementation, the oxidant may be hydrogen peroxide.

The oxidant may be present in an amount of, e.g., 0.01 wt % to 20 wt %, for 0.05 wt % to about 15 wt %, 0.1 wt % to about 10 wt %, or 0.5 wt % to 8 wt %, in the CMP slurry composition. The amount of the oxidant within these ranges is more advantageous in improving a polishing rate with respect to patterned tungsten wafers.

Catalyst

The catalyst may help improve a polishing rate with respect to patterned tungsten wafers.

Examples of the catalyst may include an iron ion compound, an iron ion complex, and a hydrate thereof. In an implementation, the iron ion compound may include, e.g., a trivalent iron cation-containing compound. The trivalent iron cation-containing compound may include a suitable compound in which trivalent iron cations are present as free cations in an aqueous solution thereof. Examples of the trivalent iron cation-containing compound may include iron chloride ($FeCl_3$ ), iron nitrate ($Fe(NO_3)_3$), and iron sulfate ($Fe_2(SO_4)_3$).

The iron ion complex may include, e.g., a trivalent iron cation-containing complex. The trivalent iron cation-containing complex may include a compound formed by reacting trivalent iron cations in an aqueous solution thereof with an organic or inorganic compound having at least one functional group, e.g., carboxylic acids, phosphoric acids, sulfuric acids, amino acids, or amines. Examples of the organic or inorganic compound may include citrate, ammonium citrate, p-toluenesulfonic acid (pTSA), 1,3-propylenediaminetetraacetic acid (PDTA), ethylenediaminetetraacetic acid (EDTA), diethylenetriaminepentaacetic acid (DTPA), nitrilotriacetic acid (NTA), and ethylenediamine-N,N'-disuccinic acid (EDDS). Examples of the trivalent iron cation-containing complex may include ferric citrate, ferric ammonium citrate, Fe(III)-pTSA, Fe(III)-PDTA, and Fe(III)-EDTA.

In an implementation, the catalyst, e.g., the iron ion compound, the iron ion complex, or the hydrate thereof, may be present in an amount of, e.g., 0.001 wt % to 10 wt %, 0.001 wt % to 5 wt %, 0.001 wt % to 1 wt %, 0.001 wt % to 0.5 wt %, or 0.002 wt % to 0.1 wt %, in the CMP slurry composition. The amount of the catalyst within these ranges may be advantageous in improving a polishing rate with respect to patterned tungsten wafers.

Organic acid

The organic acid may help stabilize the pH of the CMP slurry composition.

Examples of the organic acid may include carboxylic acids, such as malonic acid, maleic acid, and malic acid, and amino acids, such as glycine, isoleucine, leucine, phenylalanine, methionine, threonine, tryptophan, valine, alanine, arginine, cysteine, glutamine, histidine, proline, serine, tyrosine, and lysine.

In an implementation, the organic acid may be present in an amount of, e.g., 0.001 wt % to 10 wt %, 0.002 wt % to 5 wt %, 0.005 wt % to 1 wt %, or 0.01 wt % to 0.5 wt %, in the CMP slurry composition. Within these ranges, the organic acid may further stabilize the pH of the CMP slurry composition.

In an implementation, the CMP slurry composition may have a pH of, e.g., 1 to 6, 1.5 to 5, or 2 to 4. Within these ranges, patterned tungsten wafers may be easily oxidized, thereby preventing reduction in polishing rate.

In an implementation, the CMP slurry composition may further include a pH regulator to adjust the pH of the CMP slurry composition to the value specified herein.

In an implementation, the pH regulator may include an inorganic acid, e.g., nitric acid, phosphoric acid, hydrochloric acid, or sulfuric acid; or an organic acid, e.g., an organic acid having a pKa of 6 or less. In an implementation, the organic acid may include, e.g., acetic acid or phthalic acid. In an implementation, the pH regulator may include a base, e.g., aqueous ammonia, sodium hydroxide, potassium hydroxide, ammonium hydroxide, sodium carbonate, or potassium carbonate.

Besides the aforementioned components, the CMP slurry composition according to one embodiment may further include suitable additives, e.g., a biocide, a surfactant, a dispersant, a modifier, or a surface-active agent. The additives may be present in an amount of, e.g., 0.0001 wt % to 5 wt %, 0.0005 wt % to 1 wt % or 0.001 wt % to 0.5 wt %, in the CMP slurry composition. Within these ranges, the additives may provide desired effects without reduction in polishing rate.

In accordance with another embodiment, there is provided a method of polishing patterned tungsten wafers. The method may include polishing a patterned tungsten wafer using the CMP slurry composition for patterned tungsten wafers according to an embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

A CMP slurry composition was prepared by mixing 0.5 wt % of silica particles having an average particle diameter ($D_{50}$) of about 95 nm and a charge of about 35 mV as an abrasive, with 0.004 wt % of a non-dendrimeric poly(amidoamine) (Helux 3316, Polymer Factory Sweden AB, weight average molecular weight: 5,100 g/mol), 0.03 wt % of iron nitrate nonahydrate as a catalyst, 0.04 wt % of malonic acid and 0.04 wt % of glycine as organic acids, and deionized water as a solvent, based on the total weight of the CMP slurry composition. The CMP slurry composition was adjusted to a pH of 2.5 using a pH regulator. Then, 5 wt % of hydrogen peroxide was added as an oxidant to the CMP slurry composition before evaluation of a polishing rate with respect to patterned tungsten wafers or evaluation of a tungsten corrosion rate.

EXAMPLE 2

A CMP slurry composition was prepared in the same manner as in Example 1 except that the amount of the non-dendrimeric poly(amidoamine) (Helux 3316) was changed to 0.006 wt %.

EXAMPLE 3

A CMP slurry composition was prepared in the same manner as in Example 1 except that the amount of the non-dendrimeric poly(amidoamine) (Helux 3316) was changed to 0.008 wt %.

EXAMPLE 4

A CMP slurry composition was prepared in the same manner as in Example 1 except that 0.004 wt % of a non-dendrimeric poly(amidoamine) prepared from diethyl maleate and hexamethylenediamine by the method described herein (weight average molecular weight: 8,500 g/mol) was used instead of the non-dendrimeric poly(amidoamine) (Helux 3316).

COMPARATIVE EXAMPLE 1

A CMP slurry composition was prepared in the same manner as in Example 1 except that the non-dendrimeric poly(amidoamine) (Helux 3316) was not used.

COMPARATIVE EXAMPLE 2

A CMP slurry composition was prepared in the same manner as in Example 1 except that the non-dendrimeric poly(amidoamine)(Helux 3316) was not used and a linear polyethyleneimine having an amine group (—$NH_2$) at a terminal thereof (Sigma-Aldrich Corp., average $M_n$: 2,500) was used.

COMPARATIVE EXAMPLE 3

A CMP slurry composition was prepared in the same manner as in Example 1 except that the non-dendrimeric poly(amidoamine)(Helux 3316) was not used and a branched polyethyleneimine having an amine group (—$NH_2$) at a terminal thereof (Sigma-Aldrich Corp., average $M_n$: 1,800) was used.

COMPARATIVE EXAMPLE 4

A CMP slurry composition was prepared in the same manner as in Example 1 except that the non-dendrimeric poly(amidoamine)(Helux 3316) was not used and 0.004 wt % of generation 2.0 PAMAM dendrimer having an ethylenediamine core and an amine group (—$NH_2$) at a terminal thereof (Formula 12, Sigma-Aldrich Corp.) was used.

[Formula 12]

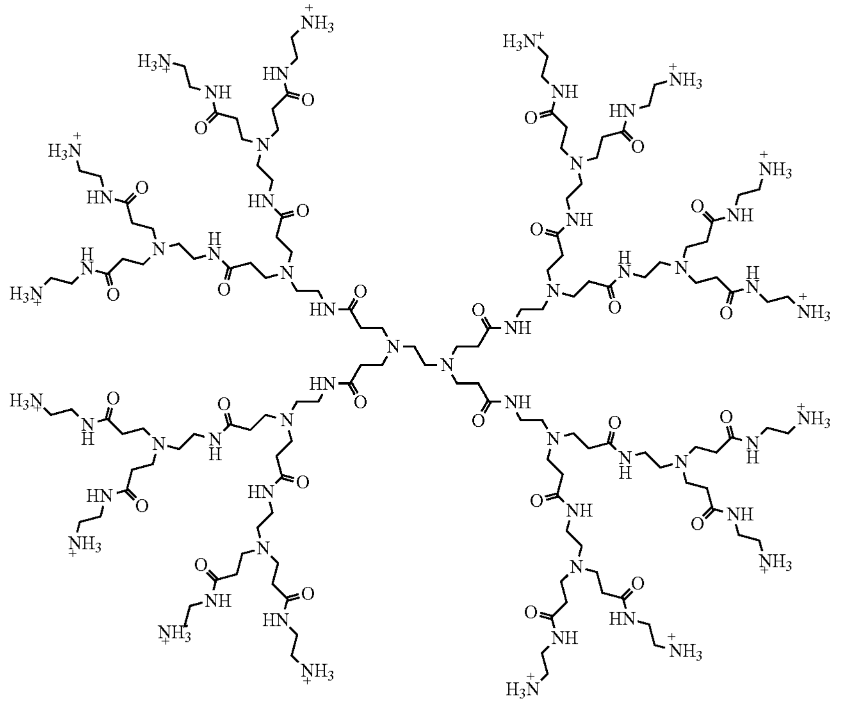

Evaluation Example 1: Tungsten Corrosion Rate (unit: Å/min)

A tungsten corrosion rate was measured at a temperature of 50° C. Specifically, as noted above, the 5 wt % of hydrogen peroxide was added as an oxidant to each of the CMP slurry compositions prepared in the Examples and Comparative Examples, followed by etching a blanket tungsten wafer (3 cm×3 cm) with the CMP slurry composition, and then a difference in film thickness before and after etching was calculated based on measurements of electrical resistance.

Evaluation Example 2: Evaluation of Polishing Characteristics

Each of the CMP slurry compositions prepared in Examples and Comparative Examples was evaluated as to polishing characteristics under the following polishing evaluation conditions:

(1) Polishing instrument: Reflexion 300 mm (AMAT Co., Ltd.)

(2) Polishing conditions

Polishing pad: IC1010/SubaIV Stacked (Rodel Inc.)
Head speed: 101 rpm
Platen speed: 100 rpm
Pressure: 2.5 psi
Retainer ring pressure: 8 psi
Slurry flow rate: 250 ml/min
Polishing time: 45 seconds (3) Polishing target Evaluation of recess level: A commercially available patterned tungsten wafer (MIT 854, 300 mm)

Evaluation of tungsten polishing rate: A blanket wafer fabricated by sequentially depositing titanium nitride (TiN) and tungsten on a polycrystalline silicon substrate to thicknesses of 300 Åand 6,000 Å, respectively.

(4) Analysis method

Polishing rate with respect to patterned tungsten wafer (unit: Å/min): A difference in film thickness before and after polishing under the above conditions was calculated based on measurements of electrical resistance.

Recess level (unit: nm): After polishing the wafer under the above polishing conditions, a recess level was calculated by measuring the profile of a 0.18 μm×0.18 μm area of the wafer using an atomic force microscope (Uvx-Gen3, Bruker Corporation).

TABLE 1

| | Example | | | | Comparative Example | | | |
|---|---|---|---|---|---|---|---|---|
| | 1 | 2 | 3 | 4 | 1 | 2 | 3 | 4 |
| Tungsten corrosion rate (A/min) | 35 | 63 | 29 | 61 | 180 | 208 | 98 | 63 |
| Tungsten polishing rate (A/min) | 4323 | 3872 | 3217 | 3022 | 4847 | 401 | 332 | 1025 |
| Recess level (nm) | 10.2 | 8.6 | 8.3 | 11.7 | 30.1 | — | — | 9.9 |

*For the CMP slurry compositions of Comparative Examples 2 and 3, recess level measurement was not performed due to low tungsten polishing rates thereof.

As shown in Table 1, the CMP slurry compositions according to Examples 1-4 exhibited improved flatness of patterned tungsten wafers, minimized reductions in polishing rate with respect to patterned tungsten wafers, and reduced a tungsten corrosion rate.

Conversely, the compositions of the Comparative Examples, in which the non-dendrimeric poly(amidoamine) according to an embodiment was not used or was replaced with a different compound, failed to achieve all the effects of the Examples.

By way of summation and review, a CMP composition for patterned tungsten wafers may help improve flatness of a patterned tungsten wafer by reducing a recess level on the wafer, and may include a corrosion inhibitor. In some compositions, amino acids may be used as the corrosion inhibitor. However, amino acids may have a limitation in reducing a recess level and thus using a cationic functional group-containing polymer may be considered. The cationic functional group-containing polymer could significantly reduce a polishing rate with respect to patterned tungsten wafers, despite being more effective in reducing a recess level than amino acids.

One or more embodiments may provide a CMP slurry composition for patterned tungsten wafers, which may help improve flatness of patterned tungsten wafers, minimize reduction in polishing rate with respect to patterned tungsten wafers, and reduce corrosion of patterned tungsten wafers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A CMP slurry composition for patterned tungsten wafers, the CMP slurry composition comprising:
a solvent;
an abrasive; and
a non-dendrimeric poly (amidoamine),
wherein the non-dendrimeric poly (amidoamine) has a random hyperbranched structure, and
wherein the non-dendrimeric poly (amidoamine) is prepared by reacting an ester having at least one ester group and at least one C═C bond with an amine having at least one primary amine group.

2. The CMP slurry composition as claimed in claim 1, wherein the non-dendrimeric poly(amidoamine) includes a primary amine group ($NH_2$), a secondary amine group (NH), a carboxyl group (COOH), or COOZ, in which Z is a $C_1$ to $C_4$ alkyl group.

3. The CMP slurry composition as claimed in claim 2, wherein the non-dendrimeric poly (amidoamine) includes:
the primary amine group ($NH_2$) or the secondary amine group (NH); and
the carboxyl group (COOH) or COOZ, in which Z is a $C_1$ to $C_4$ alkyl group.

4. The CMP slurry composition as claimed in claim 1, wherein the non-dendrimeric poly(amidoamine) is prepared by reacting an ester having at least one ester group and at least one C=C bond with a diamine having two primary amine groups.

5. The CMP slurry composition as claimed in claim 1, wherein the non-dendrimeric poly(amidoamine) is prepared by reacting a diester having two ester groups and one C=C bond with a diamine having two primary amine groups.

6. The CMP slurry composition as claimed in claim 5, wherein:

the diester includes a compound represented by Formula 1,

[Formula 1]

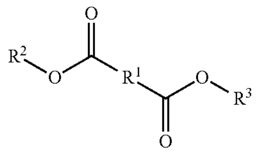

in Formula 1, $R^1$ is a divalent substituted or unsubstituted $C_2$ to $C_4$ alkylene group having at least one C=C bond, and $R^2$ and $R^3$ are each independently a $C_1$ to $C_4$ alkyl group; and the diamine includes a substituted or unsubstituted $C_2$ to $C_6$ alkylene diamine.

7. The CMP slurry composition as claimed in claim 1, wherein the CMP slurry composition includes:

0.001 wt % to 20 wt % of the abrasive, and 0.0001 wt % to 0.1 wt % of the non-dendrimeric poly (amidoamine), all wt % being based on a total weight of the CMP slurry composition.

8. The CMP slurry composition as claimed in claim 1, further comprising an oxidant, a catalyst, or an organic acid.

9. The CMP slurry composition as claimed in claim 1, wherein the CMP slurry composition has a pH of 1 to 6.

10. The CMP slurry composition as claimed in claim 1, wherein the non-dendrimeric poly (amidoamine) has have a weight average molecular weight of 25,000 g/mol to 50,000 g/mol.

11. A tungsten polishing method comprising polishing tungsten using the CMP slurry composition for patterned tungsten wafers as claimed in claim 1.

* * * * *